United States Patent
Nagasawa et al.

(10) Patent No.: US 6,310,391 B1
(45) Date of Patent: Oct. 30, 2001

(54) MOUNTED STRUCTURE OF CIRCUIT BOARD AND MULTI-LAYER CIRCUIT BOARD THEREFOR

(75) Inventors: Megumu Nagasawa; Masakazu Sugimoto; Yasushi Inoue; Kei Nakamura, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/334,631

(22) Filed: Jun. 17, 1999

(30) Foreign Application Priority Data

Jun. 23, 1998 (JP) .................................................. 10-176421

(51) Int. Cl.$^7$ .................................................. H01L 23/053
(52) U.S. Cl. ............................ 257/700; 257/711; 257/720
(58) Field of Search ...................................... 257/700, 701, 257/707, 711, 720, 723

(56) References Cited

U.S. PATENT DOCUMENTS

| | | | |
|---|---|---|---|
| 5,198,693 | 3/1993 | Imken et al. | 257/720 |
| 5,637,802 | 6/1997 | Frick et al. | 73/724 |

FOREIGN PATENT DOCUMENTS

| | | |
|---|---|---|
| 0 567 306 A2 | 10/1993 | (EP) . |
| 0 911 876 A2 | 4/1999 | (EP) . |

(List continued on next page.)

OTHER PUBLICATIONS

Time–Frequency Analysis of Transient Pressure Signals for a Mechanical Heart Valve Cavitation Study, by A. Yu et al., *ASAIO Journal*, vol. 44, No. 5, pp. M475–M479, (Sep.–Oct. 1998).

"Transient Pressure Signals in Mechanical Heart Valve Cavitation", by Z. Wu et al., *ASAIO Journal*, pp. M555–M561, (1996).

(List continued on next page.)

*Primary Examiner*—Don Wong
*Assistant Examiner*—Shih-Chao Chen
(74) *Attorney, Agent, or Firm*—Sughrue, Mion, Zinn, Macpeak & Seas, PLLC

(57) ABSTRACT

The present invention provides a mounted structure of circuit board which can be prepared by a simple method and exhibits a good heat dissipation from chip and undergoes relaxed heat stress and a multi-layer circuit board to be incorporated in the mounted structure. A novel mounted structure of circuit board is provided comprising a core material embedded in an insulating layer, said core material having a metal layer with a heat conductivity of not less than 100 W/m·K provided on at least one side of an Ni—Fe alloy foil, said insulating layer comprising a wire conductor provided and a semiconductor element mounted on at least one side thereof, characterized in that a solder metal member for heat conduction is provided interposed between said semiconductor element and said core material so that said semiconductor element and said core material are connected to each other. The mounted structure of circuit board comprises a 6-layer circuit board 2 having a laminate of three sheets of double-sided circuit boards 1 and a chip 13 connected to a circuit 5 on the uppermost layer. The core material 3 embedded in the intraboard insulating layer 4 in various double-sided circuit board 1 comprises a copper layer 3*a* having a heat conductivity of 393 W/·K provided on at least one side of an Ni—Fe alloy foil 25. The chip 13 and the underlying core material 3 are connected to each other with a solder metal member 10. The core material 3 on the horizontally adjacent double-sided circuit boards 1 are similarly connected to each other with the solder metal member 10.

4 Claims, 4 Drawing Sheets

U.S. PATENT DOCUMENTS

| | | |
|---|---|---|
| A-61-212096 | 9/1986 | (JP). |
| A-5-136537 | 6/1993 | (JP). |
| A-5-218637 | 8/1993 | (JP). |
| A-6-151662 | 5/1994 | (JP). |
| A-7-297560 | 11/1995 | (JP). |
| A-8-288649 | 11/1996 | (JP). |

OTHER PUBLICATIONS

Cavitation in Pumps, Pipes and Valves, *Process Engineering*, pp. 47 and 49 (Jan. 1990).

"Quantification of Heart Valve Cavitation Based on High Fidelity Pressure Measurements", by L. Garrison et al., *Advances in Bioengineering*, vol. 28, pp. 297–298 (1994).

"Monitoring and Diagnosis of Cavitation in Pumps and Valves Using the Wigner Distribution", by K. Ng, *Hydroacoustic Facilities, Instrumentation, and Experimental Techniques*, pp. 31–36 (1991).

"Developing Predictive Models for Cavitation Erosion", by R. Mahini et al., *Codes and Standards in a Global Environment*, pp. 189–192 (1993).

"Self–Diagnosing Intelligent Motors: A Key Enabler for Next Generation Manufacturing Systems", by F. Discenzo et al., *The Institute of Electrical Engineers*, pp. 3/1–3/4 (1999).

MOUNTED STRUCTURE OF CIRCUIT BOARD AND MULTI-LAYER CIRCUIT BOARD THEREFOR

FIELD OF THE INVENTION

The present invention relates to a mounted structure of circuit board and a multi-layer circuit board therefor.

BACKGROUND OF THE INVENTION

With the recent tendency towards the reduction of the size and the enhancement of the properties of electronic apparatus, it has been required that semiconductor apparatus and multi-layer printed-wiring boards on which they are mounted have reduced size, reduced thickness, high performance and high reliability. In order to meet these requirements, the mounting method has been switched from pin insertion method to surface mount method. In recent years, a mounting method called bare chip mounting involving the direct mounting of chips on printed circuit board has been studied.

In accordance with the bare chip mounting method, silicon chips are directly mounted on a printed circuit board. However, since silicon chips exhibit a thermal expansion coefficient of from 3 to 4 ppm/° C. and printed circuit boards exhibit a thermal expansion coefficient of from 15 to 20 ppm/° C., the resulting difference in thermal expansion coefficient between the two components causes the generation of stress, lowering the reliability in connection of mounted structure. In the case of flip chip mounting, such a stress causes destruction of connection, causing defects such as malconduction.

In order to relax such a stress, it is practiced to inject an adhesive called underfill into the gap between the chip thus mounted and the circuit board. As such an underfill there is used a thermosetting resin. The purpose of this underfill is to disperse the stress due to the difference in thermal expansion between chip and circuit board.

In order to relax the stress of the printed-wiring board itself, a multi-layer printed-wiring board is proposed comprising an absorption layer for absorbing interlayer shear strain provided interposed between layers of the multi-layer printed-wiring board and having a stepwise vertical change in the horizontal thermal expansion coefficient of the each layer (as disclosed in JP-A-7-297560 (The term "JP-A" as used herein means an "unexamined published Japanese patent application")).

On the other hand, with the recent enhancement of performance of electronic apparatus, semiconductor chips used tend to generate raised heat. The heat accumulated in the chips causes a drop of reliability of the chips. Thus, it has been practiced to provide chips or packages with a heat dissipation fin or heat sink which is air-cooled by a fan.

With the rise in the number of I/O pins on chips, it has been more and more required that the board on which chips are mounted be formed in multi-layers. As such a multi-layer wiring board there has been proposed a built-up multi-layer wiring board obtained by alternatingly laminating an insulating layer made of a photosensitive resin and a conductor layer formed by plating or vacuum evaporation on one or both sides of a board. As another multi-layer wiring board there has been proposed a multi-layer wiring board obtained by repeating a procedure involving the formation of an electrically conductive paste on one side (copper-clad surface) of a copper-clad glass epoxy laminate as protrusions using a dispenser and pressing of an adhesive sheet and a copper foil on the laminate (as disclosed in JP-A-8-288649). As a further multi-layer wiring board there has been proposed a multi-layer wiring board obtained by alternatingly laminating an insulating layer and a wire conductor on an Ni—Fe alloy as a substrate or by forming a solder pad on the surface of the multi-layer wiring board by photoengraving process, and then integrating the laminate under heating and pressure (as disclosed in JP-A-61-212096).

However, even if stress is relaxed by the foregoing means, the mounted structure or circuit board leaves something to be desired in reliability in connection. In order to secure higher reliability, it is required that heat generated by chips be dissipated or the thermal expansion coefficient of the circuit board be lowered.

Further, since the modern electronic apparatus must meet growing demand for portability and hence reduction of size, thickness and weight, the foregoing heat dissipation structure has been used less and less.

The above multi-layer wiring boards which meet the demand for the increase of the number of I/O pins on chips find various difficulties in production. In other words, the foregoing built-up multi-layer wiring board finds various difficulties. For example, such a built-up multi-layer board must be prepared at a complicated process involving a large number of steps. Further, such a built-up multi-layer board can be prepared in only a low yield. Thus, such a built-up multi-layer board cannot be delivered rapidly. The foregoing other multi-layer wiring boards comprising protrusions formed of an electrically conductive paste by a dispenser or the like find difficulties in reliability in connection, connecting resistance, etc. Further, such multi-layer wiring boards can be hardly applied to fine circuits. Moreover, such multi-layer wiring boards must be repeatedly pressed by times corresponding to the number of required layers to realize the multi-layer form, requiring much time for production. Further, the foregoing other multi-layer wiring boards comprising an Ni—Fe alloy as a substrate require the use of vacuum evaporation method or sputtering method to form a thin metal layer. Thus, these multi-layer wiring boards can be obtained only at a reduced productivity and hence at a raised cost.

SUMMARY OF THE INVENTION

It is therefore an object of the present invention to provide a mounted structure of circuit board which can be prepared by a simple method and exhibits a good heat dissipation from chip and undergoes relaxed thermal stress and a multi-layer circuit board to be incorporated in the mounted structure.

The above object of the present invention will become more apparent from the following detailed description and examples.

A first embodiment of the present invention is a mounted structure of circuit board comprising a core material embedded in an insulating layer, said core material having a metal layer with a heat conductivity of not less than 100 W/m·K provided on at least one side of an Ni—Fe alloy foil, said insulating layer comprising a wire conductor provided and a semiconductor element mounted on at least one side thereof, characterized in that a solder metal member for heat conduction is provided interposed between said semiconductor element and said core material so that said semiconductor element and said core material are connected to each other.

A second embodiment of the present invention is a multi-layer circuit board for use in such a mounted structure of circuit board wherein core materials for vertically adjacent circuit boards are connected to each other with a solder metal member for heat conduction.

In a mounted structure of circuit board, it is required that heat generated in semiconductor elements be rapidly dissipated horizontally along the surface of the circuit board to facilitate heat dissipation from the semiconductor elements. It is also required that the difference in thermal expansion between semiconductor element and circuit board be reduced to relax thermal stress. To this end, it is required that the thermal expansion of the wire conductor, to which the increase of thermal expansion of the circuit board is mainly attributed, be suppressed. Paying their attention to the kind of the core material in the circuit board and the construction of the mounted structure, the inventors made extensive studies of mounted structure of circuit board which undergoes relaxed thermal stress and shows a good heat dissipation from chip. As a result, it was found that the direct connection of a semiconductor element to a core material comprising a metal layer with a heat conductivity of not less than 100 W/m·K provided on at least one side of an Ni—Fe alloy foil with a solder metal member for heat conduction being provided interposed therebetween makes it possible to relax thermal stress and facilitate heat dissipation from semiconductor elements. The present invention has thus been worked out. In other words, in accordance with the present invention, when current flows through the wire conductor, the wire conductor and the semiconductor element generate heat which then passes through the solder metal member to the core material from which it is then dissipated horizontally along the surface thereof. The heat dissipation makes it possible to suppress the reduction of reliability accompanying the heat generation by the semiconductor elements. Since the effect of the Ni—Fe alloy foil in the core material makes it possible to suppress the thermal expansion of the circuit board, the difference in thermal expansion between semiconductor element and circuit board can be reduced, making it possible to enhance the reliability in connection in mounted semiconductor elements. Further, since such a mounted structure of core material and circuit board has a simple construction, it can be prepared by a simple method using a conventional apparatus as it is.

If the mounted structure of circuit board of the present invention comprises multi-layer circuit boards, heat generated by the semiconductor elements passes to the plurality of core materials from which it can be then fairly dissipated horizontally along the surface thereof because the core materials on these circuit boards are connected to each other with a solder metal member.

Further, if the mounted structure of circuit board of the present invention is arranged such that the circuit board is a multi-layer circuit board and solder metal members are formed vertically and almost coaxially in circuit boards, heat generated by the semiconductor elements passes to the plurality of core materials through the shortest path and thus can be effectively dissipated.

Moreover, the multi-layer circuit board to be incorporated in the mounted structure of the present invention, if semiconductor elements are to be mounted thereon, can be prepared by a simple method, and used as a circuit board which can fairly dissipate heat and relax thermal stress for the same reason as for the foregoing mounted structure of circuit board.

BRIEF DESCRIPTION OF THE DRAWINGS

By way of example and to make the description more clear, reference is made to the accompanying drawings in which.

DETAILED DESCRIPTION OF THE INVENTION

Figure 1:
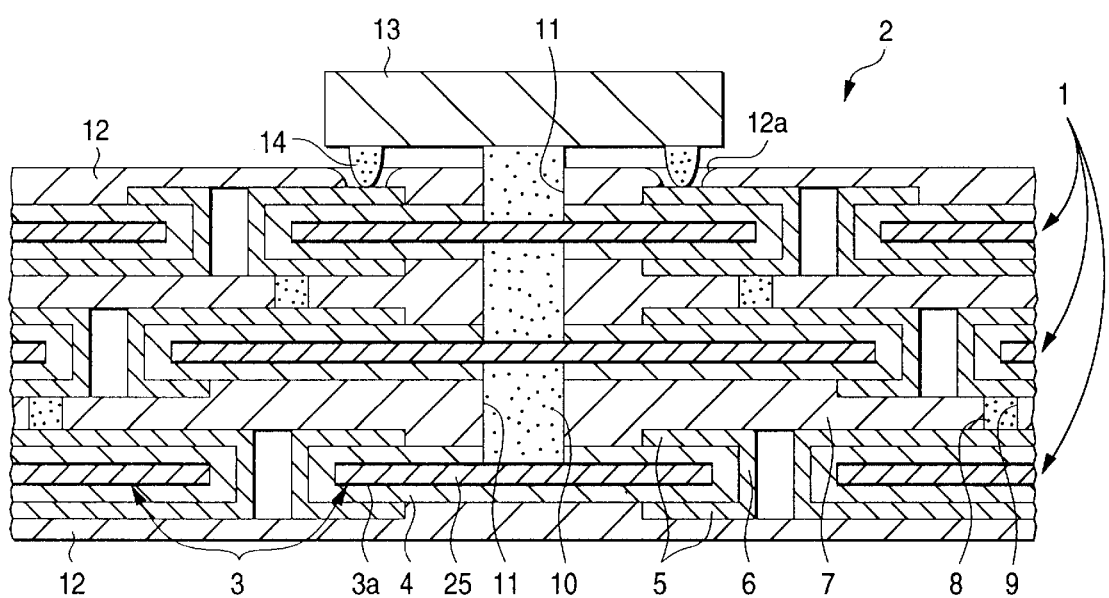
FIG. 1 is a sectional view illustrating an embodiment of the mounted structure of circuit board according to the present invention.

Embodiments of implication of the present invention will be described in detail in connection with the accompanying drawings.

FIGS. 1 to 10 each illustrate an embodiment of the mounted structure of circuit board of the present invention and the multi-layer circuit board to be incorporated therein. The foregoing embodiment of the multi-layer circuit board is a 6-layer circuit board 2 obtained by laminating 3 sheets of double-sided circuit boards 1.

The double-sided circuit board 1 comprises an intraboard insulating layer 4 having a core material 3 embedded in the central portion thereof and a circuit 5 (wire conductor) made of a copper foil provided on both sides thereof. The circuit 5 on both sides of the insulating layer 4 are electrically connected to each other with a plated through-hole 6.

In the foregoing 6-layer circuit board 2, an intraboard insulating layer 7 is provided interposed between the two sheets of double-sided circuit boards 1. The circuit 5 on the vertically adjacent double-sided circuit boards I are electrically connected to each other with a solder conductor 8. To this end, a through-hole 9 is formed in the intraboard insulating layer 7 at the portion corresponding to the connection to receive the solder conductor 8. Further, the core material 3 on the vertically adjacent double-sided circuit boards 1 are connected to each other with a solder metal member 10. To this end, a through-hole 11 is formed in the intraboard insulating layer 4 and the intraboard insulating layer 7 at their portions corresponding to the connection to receive the solder metal member 10. Moreover, the 6-layer circuit board 2 has a solder-resist 12 provided on the both sides thereof.

In the foregoing mounted structure, to the circuit 5 on the uppermost layer and the lowermost layer in the foregoing 6-layer circuit board 2 is electrically connected a chip (semiconductor element) with a solder bump 14 (the chip 13 is shown connected to only the uppermost layer). To this end, a through-hole 12a is formed in the solder resist 12 at the portion corresponding to the connection to receive the solder bump 14. Further, the foregoing chip 13 and the underlying core material 3 are connected to each other with the solder metal member 10. To this end, a through-hole 11 is formed in the solder-resist 12 and the intraboard insulating layer 4 at their portion corresponding to the connection to receive the solder metal member 10.

Figure 2:
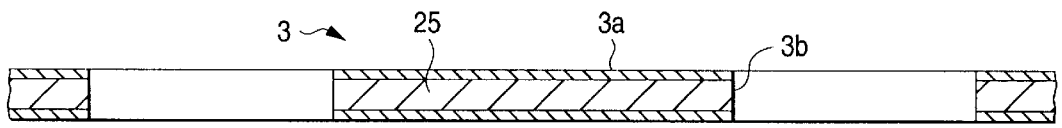
FIG. 2 is a sectional view illustrating a process for the preparation of various double-sided circuit boards in the 6-layer circuit board to be incorporated in the foregoing mounted structure.

The foregoing 6-layer circuit board 2 can be prepared as follows. In some detail, a core material 3 is prepared. As shown in FIG. 2, the core material 3 comprises a copper layer 3a with a heat conductivity of 393 W/m·K provided on at least one side of an Ni—Fe alloy foil 25 (the copper layer 3a is shown provided on both sides of the Ni—Fe alloy foil 25). The preparation of the core material 3 is accomplished by providing a copper foil on at least one side of the Ni—Fe foil 25, and then rolling the laminate until a desired thickness is reached or by plating the Ni—Fe foil 25 with copper.

Subsequently, a through-hole 3b is formed in the core material 3. The formation of the through-hole 3b is accomplished by means of a drill or punch or by wet etching process or the like.

Figure 3:
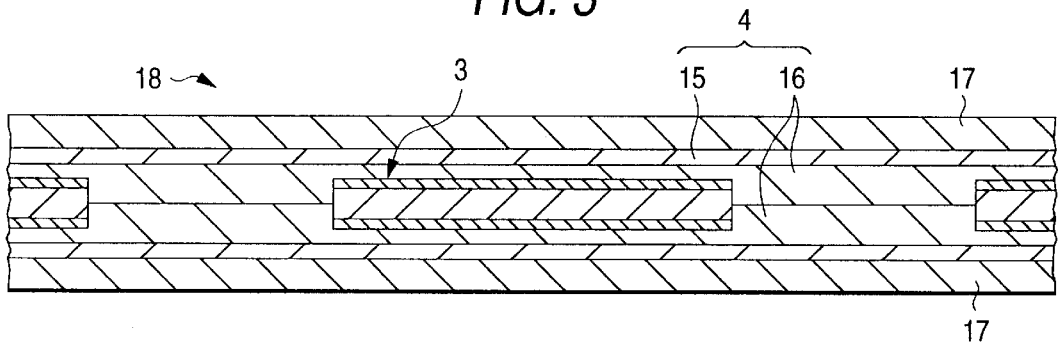
FIG. 3 is a sectional view illustrating another process for the preparation of various double-sided circuit boards in the 6-layer circuit board to be incorporated in the foregoing mounted structure.

Subsequently, as shown in FIG. 3, a two-layer copper polyimide substrate 15 is thermally contact-bonded to the both sides of the core material 3 under pressure with an adhesive sheet 16 being provided interposed therebetween. In this arrangement, the two-layer copper polyimide substrate 15 and the adhesive sheet 16 together form the foregoing intraboard insulating layer 4 (see FIG. 1). Subsequently, a conductor layer 17 made of a copper foil is formed on the both sides of the intraboard insulating layer 4. In this manner, a conductor substrate 18 is prepared.

Figure 4:
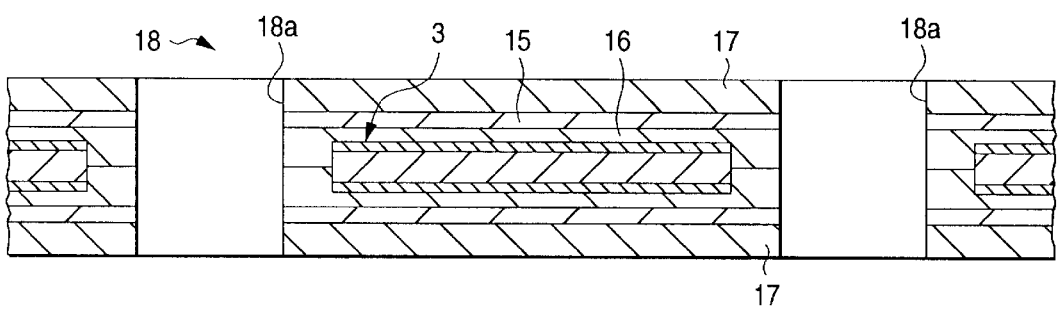
FIG. 4 is a sectional view illustrating a further process for the preparation of various double-sided circuit boards in the 6-layer circuit board to be incorporated in the foregoing mounted structure.

Subsequently, as shown in FIG. 4, a through-hole 18a having a smaller diameter than that of the foregoing through-hole 3b (see FIG. 2) formed in the core material 3 is formed in the foregoing conductor substrate 18 passing through the foregoing through-hole 3b.

Figure 5:
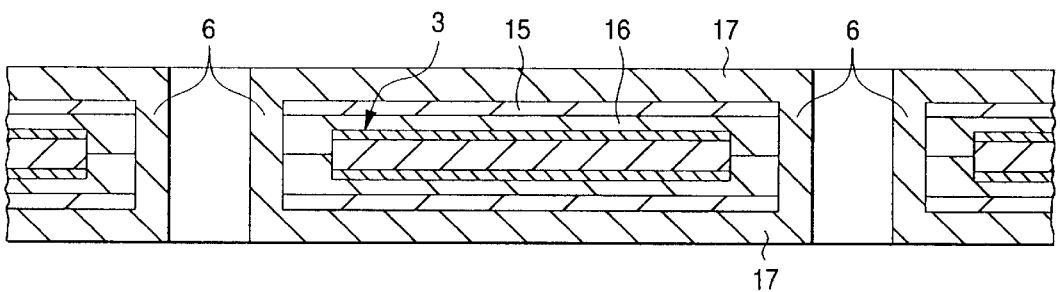
FIG. 5 is a sectional view illustrating a further process for the preparation of various double-sided circuit boards in the 6-layer circuit board to be incorporated in the foregoing mounted structure.

Thereafter, as shown in FIG. 5, the through-hole 18a is plated with copper 6 thereinside to electrically connect the conductor layer 17 on the both sides of the intraboard insulating layer 4.

Figure 6:
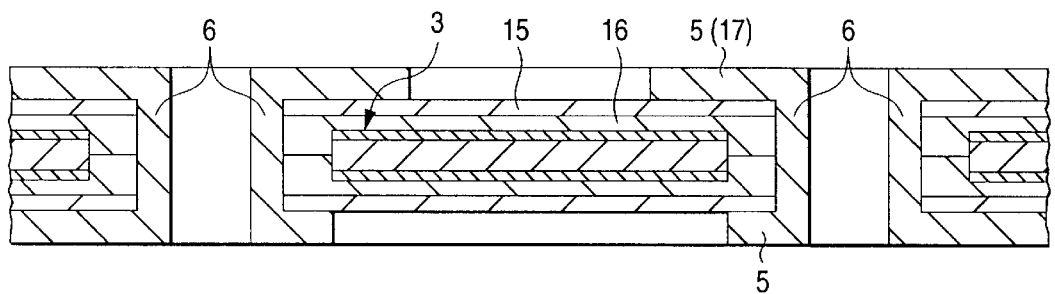
FIG. 6 is a sectional view illustrating a further process for the preparation of various double-sided circuit boards in the 6-layer circuit board to be incorporated in the foregoing mounted structure.

Subsequently, as shown in FIG. 6, the conductor layer on the both sides of the intraboard insulating layer 4 is etched to form a circuit 5 thereon.

Figure 7:
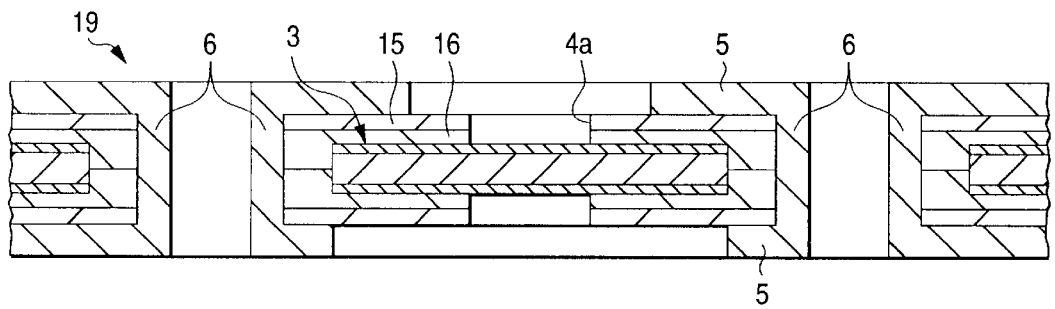
FIG. 7 is a sectional view illustrating a further process for the preparation of various double-sided circuit boards in the 6-layer circuit board to be incorporated in the foregoing mounted structure.

Subsequently, as shown in FIG. 7, the two-layer copper polyimide substrate 15 and the adhesive sheet 16 are irradiated with a laser beam to form a through-hole 4a at their portion in which the foregoing solder metal member 10 (see FIG. 1) is received. In this manner, a double-sided, circuit board main body 19 is prepared.

Figure 8:
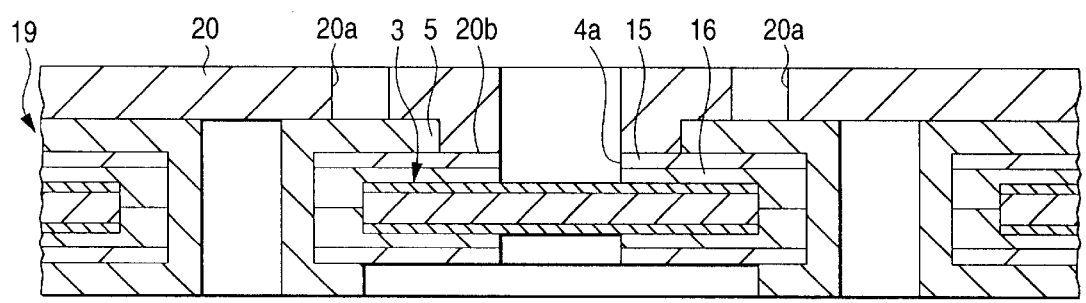
FIG. 8 is a sectional view illustrating a further process for the preparation of various double-sided circuit boards in the 6-layer circuit board to be incorporated in the foregoing mounted structure.

Subsequently, as shown in FIG. 8, an adhesive sheet 20 is thermally bonded to the upper surface of the foregoing double-sided circuit board main body 19 under pressure. The adhesive sheet 20 has been punched to form through-holes 20a and 20b therein at the portion in which the foregoing solder conductors 8 and 10 (see FIG. 1) are received, respectively.

Figure 9:
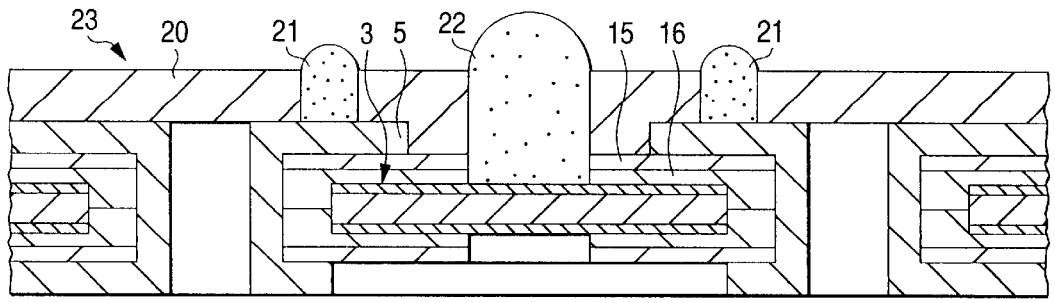
FIG. 9 is a sectional view illustrating a further process for the preparation of various double-sided circuit boards in the 6-layer circuit board to be incorporated in the foregoing mounted structure.

Subsequently, as shown in FIG. 9, a solder paste is printed on the adhesive sheet 20 through a metal mask to fill the through-hole 4a formed by laser beam and the through-holes 20a and 20b formed by punching. The main body 19 is then subjected to soldering. The flux is then washed away. Thus, solder bumps 21 and 22 are formed on the core material 3 and the circuit 5. In this manner, a double-sided circuit board 23 with solder bump is formed. Two sheets of such double-sided circuit boards 23 with solder bump are formed.

Separately, as shown in FIG. 7, a sheet of a double-sided circuit board 24 with solder bump free of adhesive sheet comprising a solder bump 22 formed thereon (see FIG. 10) is formed with the core material 3 partly exposed.

Figure 10:
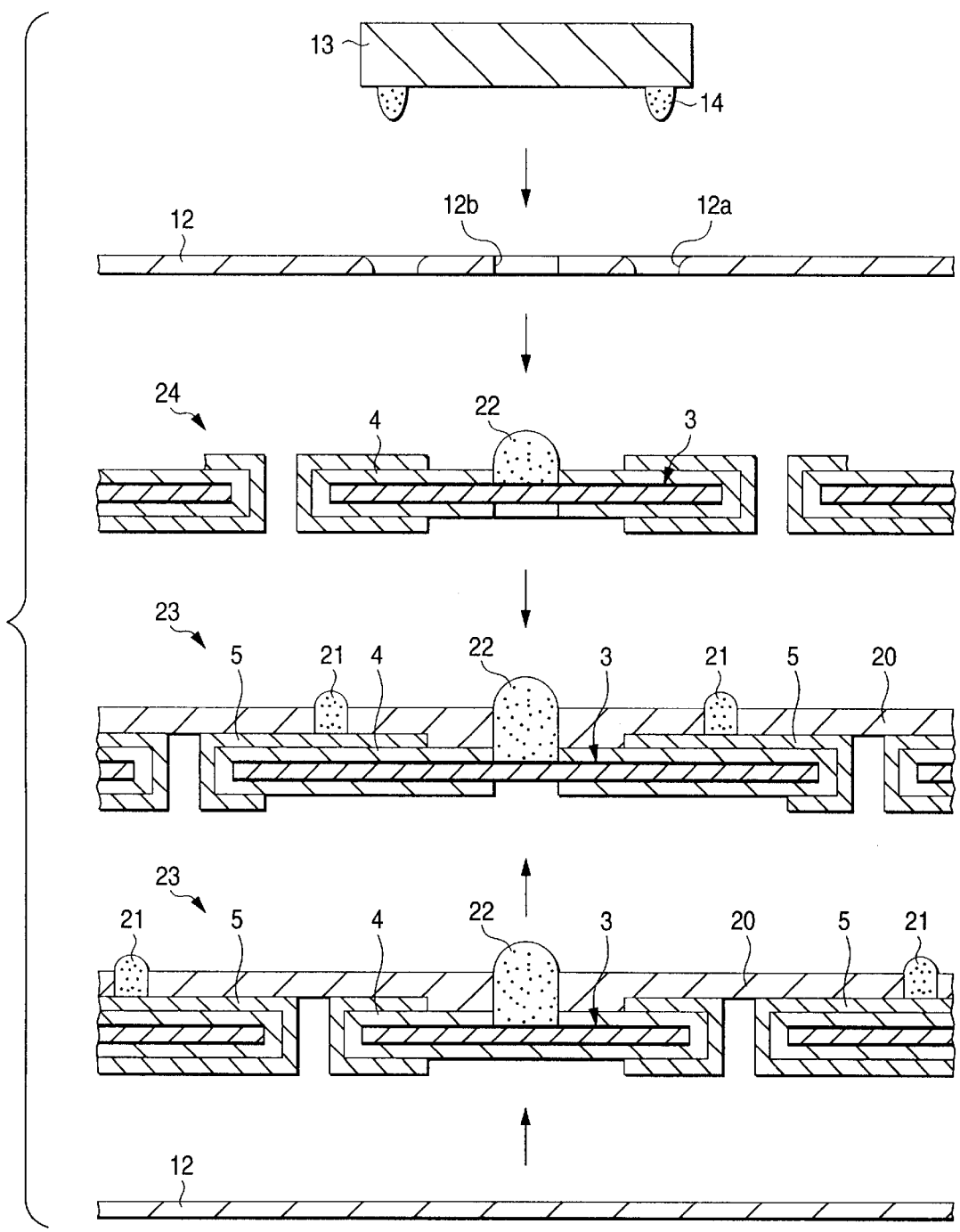
FIG. 10 is a sectional view illustrating a process for the preparation of a 6-layer circuit board to be incorporated in the foregoing mounted structure, wherein the reference numeral 1 indicates a double-sided circuit board, the reference numeral 2 indicates a 6-layer circuit board, the reference numeral 3 indicates a core material, the reference numeral 3a indicates a copper layer, the reference numeral 4 indicates an intraboard insulating layer, the reference numeral 5 indicates a circuit, the reference numeral 10 indicates a solder metal member, the reference numeral 13 indicates a chip, and the reference numeral indicates an Ni—Fe alloy foil.

Further, a solder-resist 12 (see FIG. 1) to be provided on the both sides of the 6-layer circuit board 2 is prepared. As shown in FIG. 10, the solder resist 12 has been punched to form a through-hole 12a at the portion corresponding to the position at which a solder bump 14 for connection of the foregoing chip 13 and a through-hole 12b at the portion corresponding to the position in which a solder metal member 10 (see FIG. 1) for connection of the chip 13 is received (the through-holes 12a and 12b are shown formed in only the solder-resist 12 to be provided on the surface of the 6-layer circuit board 2).

Subsequently, as shown in FIG. 10, the foregoing three sheets of double-sided circuit boards 23, 24 and two sheets of cover lays 12 are laminated positioned as required relative to each other, and then thermally bonded to each other under pressure to obtain a 6-layer circuit board 2 shown in FIG. 1. In this procedure, the solder bump 21 (see FIG. 10) on the circuit 5 forms a solder conductor 8 (see FIG. 1). The solder bump 22 (see FIG. 10) on the core material 3 forms a solder metal member 10 (see FIG. 1). The adhesive sheet 20 (see FIG. 10) forms an intraboard insulating layer 7 (see FIG. 1). Further, the through-hole 20a (see FIG. 8) forms a through-hole 9 (see FIG. 1). The through-holes 4a and 20b (see FIG. 8) and the through-holes 4a (see FIG. 7) and 12b (see FIG. 10) each form a through-hole 11 (see FIG. 1). Moreover, chips 13 are then mounted on the circuit board at required positions to obtain a mounted structure as shown in FIG. 1.

In the above structure, when current flows through the circuit 5, the circuit 5 and the chip 13 generate heat. The heat thus generated passes through the solder metal member 10 to the core material 3 from which it can then be dissipated horizontally along the surface thereof.

As mentioned above, in accordance with the foregoing embodiment of the mounted structure of the present invention, the chip 13 and the underlying core material 13 are connected to each other with the solder metal member 10. Further, the core material 3 on the vertically adjacent double-sided circuit boards 1 are similarly connected to each other with the solder metal member 10. In this arrangement, when current flows through the circuit 5, the resulting heat generated by the circuit 5 and the chip 13 can pass through the solder metal member 10 to the three-layer core material 3 from which it is then dissipated. Further, since the core material 3 is made of an Ni—Fe alloy foil 25, the thermal expansion of the various double-sided circuit boards 1 and 6-layer circuit boards 2 can be suppressed. Moreover, since the preparation of the core material 3, the formation of various through-holes and the lamination and bonding of various members can be accomplished by any known simple methods, the foregoing mounted structures can be simply prepared as well.

The present invention will be further described in the following examples and comparative examples, but the present invention should not be construed as being limited thereto.

EXAMPLE 1

A core material 3 was prepared by providing a copper foil (heat conductivity: 393 W/mK; thermal expansion coefficient: 17 ppm/° C.) on the both sides of a 36 alloy foil (nickel content: 36% by weight; iron content: 64% by weight; heat conductivity: x10 W/m·K; thermal expansion coefficient: 1.5 ppm/° C.), and then rolling the laminate until the total thickness reached 50 μm (thickness of the 36 alloy foil: 30 μm; thickness of each of the copper foils: 10 μm) and the Ni—Fe content reached 60% by volume. A through-hole 3b was then made in the core material 3 by means of a drill using a blade having a diameter of 0.3 mm. A two-layer copper polyimide substrate 15 was prepared by applying a polyimide precursor varnish (polyamic acid varnish obtained by reacting p-phenylenediamine with 3,3', 4,4'-biphenyltetrcarboxylic dihydrate in n-methylpyrrolidone) to a copper foil having a thickness of 18 μm, drying the coated material, and then subjecting the coated material to imidization in a 400° C. nitrogen atmosphere for 1 hour to provide a polyimide layer having a thickness of 20 μm thereon. As an adhesive sheet 16 for bonding the two-layer copper polyimide substrate 15 to the both sides of the core material 3 there was used a Type SPB-035A polyimide adhesive sheet produced by Nippon Steel Chemical Co., Ltd. When the laminate was bonded, the laminated was heated to a temperature of 200° C. at a pressure of 40 kg/cm² for 1 hour. A through-hole 18a was then made in the adhesive sheet 16 by means of a drill using a blade having a diameter of 0.2 mm. The through-hole 18a was then plated thereinside with copper 6 to a thickness of 5 μm. As an adhesive sheet for bonding to the both sides of the double-sided circuit main body 19 there was used a Type SPB-035A polyimide adhesive sheet produced by Nippon Steel Chemical Co., Ltd. When the laminate was bonded, the laminated was heated to a temperature of 180° C. at a pressure of 20 kg/cm² for 30 minutes. As a solder paste for use in the formation of solder bumps 14, 21 and 22 there was used Sn8RA-3AMQ (melting point: 260° C.) produced by Nihon Superior Co., Ltd. The lamination and bonding of three A sheets of double-sided circuit boards 23, 24 and two sheets of solder-resist 12 was accomplished in the same manner as mentioned above except that the laminate was heated to a temperature of 200° C. at a pressure of 30 kg/cm² for 1 hour. Thus, a 6-layer circuit board 2 was prepared. Further, chips 13 were mounted on the 6-layer circuit board 2 at the required positions to prepare a mounted structure.

EXAMPLE 2

A mounted structure was prepared in the same manner as in Example 1 except that the core material 3 was prepared by providing an aluminum foil (heat conductivity: 200 W/m·K; thermal expansion coefficient: 21 ppm/° C.) on the both sides of a 36 alloy foil (nickel content: 36% by weight; iron content: 64% by weight; heat conductivity: 10 W/m·K; thermal expansion coefficient: 1.5 ppm/° C.), and then rolling the laminate until the total thickness reached 50 μm (thickness of the 36 alloy foil: 30 μm; thickness of each of the copper foils: 10 μm) and the Ni—Fe content reached 60% by,volume.

EXAMPLE 3

A mounted structure was prepared in the same manner as in Example 1 except that the core material 3 was prepared by providing a copper foil (heat conductivity: 393 W/m·K; thermal expansion coefficient: 17 ppm/° C.) on the both sides of a 36 alloy foil (nickel content: 36% by weight; iron content: 64% by weight; heat conductivity: 10 W/m·K; thermal expansion coefficient: 1.5 ppm/° C.), and then rolling the laminate until the total thickness reached 50 μm (thickness of the 36 alloy foil: 40 μm; thickness of each of the copper foils: 5 μm) and the Ni—Fe content reached 80% by volume.

Comparative Example 1

A mounted structure was prepared in the same manner as in Example 1 except that as the core material 3 there was used a 36 alloy foil (nickel content: 36% by weight; iron content: 64% by weight; heat conductivity: 10 W/m·K; thermal expansion coefficient: 1.5 ppm/° C.) alone and the thickness of the 36 alloy foil was 50 μm (Ni—Fe content: 100% by volume).

Comparative Example 2

A mounted structure was prepared in the same manner as in Example 1 except that as the core material 3 there was used a copper foil (heat conductivity: 393 W/m·K; thermal expansion coefficient: 17 ppm/° C.) alone and the thickness of the copper foil was 50 μm (Ni—Fe content: 0% by volume).

Comparative Example 3

A mounted structure was prepared in the same manner as in Example 1 except that the solder metal member 10 with which the chip 13 and the underlying core material 3 are connected to each other, the solder metal member 10 with which the underlying core materials 3 are connected to each other and the through-holes 4a and 20a in which these solder metal members 10 are provided were not provided.

Comparative Example 4

A mounted structure was prepared in the same manner as in Example 1 except that the solder metal member 10 with which the core material 3, the chip 13 and the underlying core material 3 are connected to each other, the solder metal member 10 with which the underlying core materials 3 are connected to each other and the through-holes 4a and 20a in which these solder metal members 10 are provided were not provided.

The products of the examples of the present invention and the products of the comparative examples thus obtained were then evaluated for heat dissipation properties of mounted structure and thermal expansion properties of 6-layer circuit board 2. For the evaluation of heat dissipation properties, the chip 13 was mounted on the 6-layer circuit board 2. Current was then allowed to flow through the circuit so that 2 W heat was generated under windless conditions. The resulting temperature of the surface of the chip 13 was then calculated from the temperature of diode in the chip 13 and the potential difference. For the evaluation of thermal expansion properties, the 6-layer circuit board 2 was heated from room temperature (25° C.) to a temperature of 200° C. The heat expansion coefficient was calculated from the change in the length of the 6-layer circuit board 2. The results are set forth in Table 1 below.

TABLE 1

| Example No. | Surface temperature of chip (° C.) | Thermal expansion coefficient (ppm/° C.) |
|---|---|---|
| Example 1 | 60 | 6.0 |
| Example 2 | 64 | 6.5 |
| Example 3 | 70 | 5.0 |
| Comparative Example 1 | 120 | 4.0 |
| Comparative Example 2 | 60 | 17.0 |
| Comparative Example 3 | 100 | 6.0 |
| Comparative Example 4 | 140 | 17.0 |

The results set forth in Table 1 show that all the products of the examples of the present invention are excellent in heat dissipation from the mounted structure and the 6-layer circuit board 2 exhibits an extremely small thermal expansion.

On the contrary, the product of Comparative Example 1 exhibits a small thermal expansion of the 6-layer circuit board 2 but a poor heat dissipation from the mounted structure. This is because the core material 3 is free of metal layer having a heat conductivity of not less than 100 W/m·K. Further, the product of Comparative Example 2 exhibits a good heat dissipation from the mounted structure but a great heat expansion of the 6-layer circuit board 2. This is because the core material 3 is free of Ni—Fe alloy foil 25. Moreover, the product of Comparative Example 3 exhibits a small thermal expansion of the 6-layer circuit board 2 but a poor heat dissipation from the mounted structure similarly to the product of Comparative Example 1. This is because the chip 13 and the core material 3 are not connected to each other with the solder metal member 10 and the core materials 3 are not connected to each other with the solder metal member 10. Further, the product of Comparative Example 4 exhibits a poor heat dissipation from the mounted structure and a great thermal expansion of the 6-layer circuit board 2. This is because there is provided no core material 3.

In the above embodiment of the present invention, the circuitboard is hot limited to the foregoing 6-layer circuit-board 2. Other single-layer circuit boards or multi-layer circuit boards may be used. In the case of such a single-layer circuit board, a circuit 5 may be formed on only the surface of the intraboard insulating layer 4.

The processes for the preparation of core material 3, formation of various through-holes and lamination and bonding of various members are not limited to the foregoing embodiments of implication or examples. Other simple processes may be used.

The kind of the metal layer to be provided on at least one side of the Ni—Fe alloy foil 25 in the core material 3 is not limited to copper. Any other metals may be used so far as they exhibit a heat conductivity of not less than 100 W/m·K. For example, aluminum (Example 2), molybdenum, titanium, gold, silver or alloy thereof may be used. However, copper is desirable from the standpoint of heat conductivity or cost.

Referring to the formulation of the Ni—Fe alloy foil in the core material 3, the nickel content (% by weight) is preferably predetermined to be from 31 to 50% in an Ni—Fe binary system. This is because if the nickel content deviates from the above defined range, the alloy exhibits a raised thermal expansion itself, lowering the reliability in connection of mounted structure. A composition having a low thermal expansion obtained by incorporating cobalt in the Ni—Fe alloy is known. Such a composition may be used as necessary.

It is preferred that the total thickness of the Ni—Fe alloy foil 25 in the circuit board account for not less than 10% of the total thickness of the circuit board and greater than the total thickness of the metal layer (copper layer 3a) provided on at least one side of the Ni—Fe alloy foil 25 regardless of the number of circuit board layers (single-layer circuit board or multi-layer circuit board). This is because if the total thickness of the Ni—Fe alloy foil 25 falls below the above defined range, the circuit board exhibits a raised thermal expansion and hence a reduced reliability in connection. In the various circuit board main body 19 (see FIG. 7), the thickness of the metal layer (copper layer 3a, etc.) on the core material 3 is preferably not less than 10 μm. If the thickness of the metal layer falls below 10 μm, the resulting heat dissipation effect is lessened.

The intraboard insulating layer 4 may be made of an organic polymer to advantage from the standpoint of workability. Examples of the material employable herein include phenol resin, epoxy resin, polyester resin, polysulfone resin, polyetherimide resin, polyether ketone resin, and polyimide resin. If necessary, paper, glass cloth, glass mat, nonwoven glass cloth, Kepler fiber, etc. may be used singly or in proper combination. The adhesive sheet 16 may be made of thermosetting or thermoplastic material such as epoxy resin, phenolic resin, polyimide resin and polyamide resin, singly or in combination. From the standpoint of reliability, a polyimide resin-based material may be preferably used.

The solder conductor 8 and the solder metal member 10 may be properly made of a solder material having the composition which can be formed into a bump by a plating method or supplied in the form of paste. Preferred among these solder materials are Sn—Pb, and Sn—Ag based solder paste. The size of the solder particle is not more than 100 μm, preferably not more than 50 μm, more preferably not more than 20 μm.

The thickness of the adhesive sheet 20 to be provided interposed between the two sheets of double-sided circuit boards 1 is preferably from 0.01 mm to 1.0 mm. If the thickness of the adhesive sheet 20 falls below 0.01 mm, the resulting adhesive sheet exhibits a deteriorated workability or cannot fill the unevenness on the circuit 5 or the through-holes. On the contrary, if the thickness of the adhesive sheet 20 exceeds 1.0 mm, the through-holes 4a, 20a and 20b can hardly be filled with the solder paste, causing a drop of reliability.

As mentioned above, the mounted structure of circuit board of the present invention comprises a core material having a metal layer with a heat conductivity of not less than 100 W/m·K provided on at least one side of an Ni—Fe alloy foil and a solder metal member for heat conduction provided interposed between a semiconductor element and the core material, whereby the semiconductor element and the core material are directly connected to each other. In this arrangement, when current flows through the wire conductor on the circuit board, the wire conductor and the semiconductor generate heat which passes through the solder metal member to the core material from which it can then be dissipated horizontally along the surface thereof. This heat dissipation makes it possible to suppress the drop of reliability accompanying the heat generation by the semiconductor elements. Since the effect of the Ni—Fe alloy foil in the core material makes it possible to suppress the thermal expansion of the circuit board, the difference in thermal expansion between semiconductor element and circuit board can be reduced, making it possible to enhance the reliability in connection in mounted semiconductor elements. Further, since such a mounted structure of core material and circuit board has a simple construction, it can be prepared by a simple method using a conventional apparatus as it is.

If the mounted structure of circuit board of the present invention comprises multi-layer circuit boards, heat generated by the semiconductor elements passes to the plurality of core materials from which it can be then fairly dissipated horizontally along the surface thereof because the core materials on these circuit boards are connected to each other with a solder metal member.

Further, if the mounted structure of circuit board of the present invention is arranged such that the circuit board is a multi-layer circuit board and solder metal members are formed vertically and almost coaxially in circuit boards, heat generated by the semiconductor elements passes to the plurality of core materials through the shortest path and thus can be effectively dissipated.

Moreover, the multi-layer circuit board to be incorporated in the mounted structure of circuit board of the present invention, if semiconductor elements are to be mounted thereon, can be prepared by a simple method for the same reason as for the foregoing mounted structure of circuit board. Thus, the multi-layer circuit board can be used as a circuit board which can fairly dissipate heat and relax thermal stress.

While the invention has been described in detail and with reference to specific embodiments thereof, it will be apparent to one skilled in the art that various changes and modifications can be made therein without departing from the spirit and scope thereof.

What is claimed is:

1. A mounted structure of a circuit board comprising a core material embedded in an insulating layer, said core material having a metal layer with a heat conductivity of not less than 100 W/m·K provided on at least one side of an Ni—Fe alloy foil, said insulating layer comprising a wire conductor provided on at least one side thereof and a semiconductor element mounted on at least one side thereof, wherein a solder metal member for heat conduction is provided interposed between said semiconductor element and said core material so that said semiconductor element and said core material are connected to each other.

2. The mounted structure of a circuit board according to claim 1, wherein said circuit board is a multi-layer circuit board and core materials for vertically adjacent circuit boards are connected to each other with a solder metal member for heat conduction.

3. The mounted structure of a circuit board according to claim 2, wherein said solder metal member for heat conduction is formed vertically and essentially coaxially in said multi-layer circuit board.

4. A multi-layer circuit board for use in a mounted structure of a circuit board according to claim 2 or 3 comprising a plurality of double-sided circuit boards integrated with an adhesive layer provided interposed therebetween, said adhesive layer having a through-hole made therein at desired positions in contact with wire conductors on two double-sided.

* * * * *